(12) United States Patent
Jung et al.

(10) Patent No.: US 9,660,475 B2
(45) Date of Patent: May 23, 2017

(54) CONTROL CIRCUIT FOR REDUCING CHARGING TIME AND METHOD THEREOF

(71) Applicant: Samsung Electronics Co., Ltd., Suwon-si, Gyeonggi-do (KR)

(72) Inventors: Ku-Chul Jung, Seoul (KR); KiSun Lee, Hwaseong-si (KR); Chul-Eun Yun, Hwaseong-si (KR); Seung-Su Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 253 days.

(21) Appl. No.: 14/288,944

(22) Filed: May 28, 2014

(65) Prior Publication Data

US 2015/0002078 A1    Jan. 1, 2015

(30) Foreign Application Priority Data

Jun. 26, 2013   (KR) ........................ 10-2013-0073639

(51) Int. Cl.
  *H02J 7/00*      (2006.01)
  *H03K 17/687*    (2006.01)
  *G06F 1/26*      (2006.01)

(52) U.S. Cl.
  CPC .......... *H02J 7/0072* (2013.01); *H02J 7/0031* (2013.01); *H02J 7/0068* (2013.01); *H03K 17/6874* (2013.01); *G06F 1/263* (2013.01); *H03K 2217/0009* (2013.01)

(58) Field of Classification Search
  CPC .... H02J 9/02; H02J 9/065; H02J 7/025; H02J 7/0052; H02J 7/0004; H02J 7/0027; H02J 7/0044; H02J 7/0068; H02J 7/34; H02J 7/345; H02J 9/061; H02J 2007/0059; H02J 3/00; H02J 7/0008; H02J 7/0055
  USPC .................................................. 320/107–115
  See application file for complete search history.

(56) References Cited

U.S. PATENT DOCUMENTS

| | | | |
|---|---|---|---|
| 5,583,384 A | 12/1996 | Henry | |
| 6,259,306 B1* | 7/2001 | Brulhart | H03K 17/6874 327/434 |
| 2001/0022518 A1* | 9/2001 | Asakura | G01R 31/3679 324/426 |
| 2008/0054723 A1* | 3/2008 | Noh | H02J 7/0031 307/66 |
| 2009/0051315 A1 | 2/2009 | Wang et al. | |
| 2012/0299545 A1 | 11/2012 | Kuraishi | |
| 2014/0219154 A1 | 8/2014 | Liu et al. | |

FOREIGN PATENT DOCUMENTS

| | | | |
|---|---|---|---|
| EP | 1895635 A1 | 3/2008 | |
| EP | 2528188 A1 | 11/2012 | |
| EP | 2765824 A1 | 8/2014 | |
| WO | 2013/033948 A1 | 3/2013 | |

* cited by examiner

*Primary Examiner* — Binh Tat
(74) *Attorney, Agent, or Firm* — Jefferson IP Law, LLP

(57) ABSTRACT

A control circuit for reducing a charging time and a method thereof are provided. The charging device includes an input unit configured to receive a control signal indicating that applied power is process power, and a switch configured to cut off a path between a terminal set and a battery while the process power is applied, when the applied power is the process power.

18 Claims, 5 Drawing Sheets

CONTROL CIRCUIT FOR REDUCING CHARGING TIME AND METHOD THEREOF

CROSS-REFERENCE TO RELATED APPLICATION(S)

This application claims the benefit under 35 U.S.C. §119(a) of a Korean patent application filed on Jun. 26, 2013 in the Korean Intellectual Property Office and assigned Serial number 10-2013-0073639, the entire disclosure of which is hereby incorporated by reference.

TECHNICAL FIELD

The present disclosure relates to a control circuit for reducing a charging time and a method of driving the same.

BACKGROUND

Electronic devices such as mobile terminals, tablet computers and smartphones are easy to carry and are able to store and execute various programs. Furthermore, such electronic devices allow users to use various additional functions such as internet search, photographing, video recording, MP3 playback, reception of Digital Multimedia Broadcasting (DMB) and link to a Global Positioning System (GPS). As the electronic devices are more frequently used due to the various functions, battery power consumption increases.

Therefore, increasing capacity of batteries for the users to use the electronic devices for a longer time may be desirable. However, the increase of the battery capacity may increase a charging time, thereby inconveniencing the user.

Therefore, a need exists for a control circuit for reducing a battery charging time and a method for driving the same.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a control circuit for reducing a charging time and a method for operating the same.

Another aspect of the present disclosure is to provide a control circuit for separating process power from battery power without using an additional switch for a process and a method for operating the same.

Another aspect of the present disclosure is to provide a control circuit for increasing a Constant Current (CC) period by reducing a Constant Voltage (CV) resistance value generated due to a switch for a process and a method for operating the same.

Another aspect of the present disclosure is to provide a control circuit for reducing a charging time by increasing a CC period and a method for operating the same.

In accordance with an aspect of the present disclosure, a charging device is provided. The charging device includes an input unit configured to receive a control signal indicating that applied power is process power, and a switch configured to cut off a path between a terminal set and a battery while the process power is applied, when the applied power is the process power.

In accordance with another aspect of the present disclosure, the switch may cut off the path between the terminal set and the battery during charging initialization, when the applied power is charging power, and wherein the charging device further includes an output unit configured to supply corresponding power to the terminal set while the path between the terminal set and the battery is cut off.

In accordance with another aspect of the present disclosure, the switch may connect the path between the terminal set and the battery when the charging initialization is completed, and wherein the output unit may supply a charging current or a charging voltage to the battery.

In accordance with another aspect of the present disclosure, the corresponding power may be the charging power or operating power of the terminal set obtained by converting the charging power, wherein the process power may be power initially set when a terminal is manufactured.

In accordance with another aspect of the present disclosure, the switch may include a bidirectional back to back Field-Effect Transistor (FET).

In accordance with another aspect of the present disclosure, in the switch, a source terminal of a first FET may be connected to a source terminal of a second FET, a gate terminal of the first FET may be connected to a gate terminal of the second FET, a drain terminal of the first FET may be connected to the terminal set, a drain terminal of the second FET may be connected to the battery, the drain terminal and the source terminal of the first FET may be connected to a first diode, and the drain terminal and the source terminal of the second FET may be connected to a second diode.

In accordance with another aspect of the present disclosure, the process power may be directly provided to the terminal set.

In accordance with another aspect of the present disclosure, an electronic device is provided. The electronic device includes a terminal set, a battery, and a charging unit configured to control a power path between the terminal set and the battery and supply process power or charging power to the terminal set, wherein the charging unit includes an input unit configured to receive a control signal indicating that applied power is the process power and a switch configured to cut off the path between the terminal set and the battery while the process power is applied, when the applied power is the process power.

In accordance with another aspect of the present disclosure, the switch may cut off the path between the terminal set and the battery during charging initialization, when the applied power is the charging power, and wherein the electronic device further includes an output unit configured to supply corresponding power to the terminal set while the path between the terminal set and the battery is cut off.

In accordance with another aspect of the present disclosure, the switch may connect the path between the terminal set and the battery when the charging initialization is completed, and wherein the output unit may supply a charging current or a charging voltage to the battery.

In accordance with another aspect of the present disclosure, the corresponding power may be the charging power or operating power of the terminal set obtained by converting the charging power, and wherein the process power may be power initially set when a terminal is manufactured. The switch may include a bidirectional back to back FET.

In accordance with another aspect of the present disclosure, in the switch, a source terminal of a first FET may be connected to a source terminal of a second FET, a gate terminal of the first FET may be connected to a gate terminal of the second FET, a drain terminal of the first FET may be connected to the terminal set, a drain terminal of the second FET may be connected to the battery, the drain terminal and the source terminal of the first FET may be connected to a first diode, and the drain terminal and the source terminal of the second FET may be connected to a second diode.

In accordance with another aspect of the present disclosure, the process power may be directly provided to the terminal set.

In accordance with another aspect of the present disclosure, a method for controlling power of a charging device is provided. The method includes determining whether applied power is process power or charging power, cutting off a path between a terminal set and a battery while the process power is applied, when the applied power is the process power, and supplying the process power to the terminal set.

In accordance with another aspect of the present disclosure, the method may further include cutting off the path between the terminal set and the battery during charging initialization, when the applied power is the charging power, and supplying corresponding power to the terminal set.

In accordance with another aspect of the present disclosure, the method may further include connecting the path between the terminal set and the battery when the charging initialization is completed, and supplying a charging current or a charging voltage to the battery.

In accordance with another aspect of the present disclosure, the corresponding power may be the charging power or operating power of the terminal set obtained by converting the charging power, and wherein the process power may be power initially set when a terminal is manufactured.

In accordance with another aspect of the present disclosure, the connecting or cutting off the path between the terminal set and the battery according to the process power or the charging power may be controlled by a single switch.

In accordance with another aspect of the present disclosure, the process power may be directly provided to the terminal set.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

The same reference numerals are used to represent the same elements throughout the drawings.

DETAILED DESCRIPTION

Figure 1:
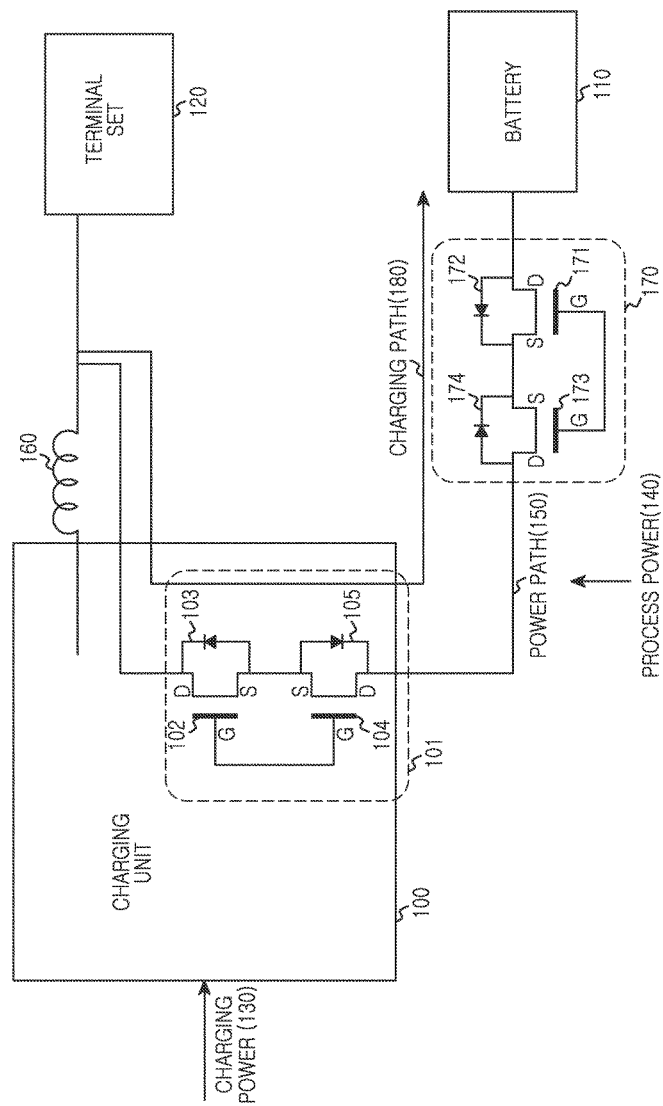
FIG. 1 is a circuit diagram illustrating a battery control circuit including an additional switch for separating process power from battery power in an electronic device having a built-in battery according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

According to various embodiments of the present disclosure, an electronic device may include communication functionality. For example, an electronic device may be a smart phone, a tablet Personal Computer (PC), a mobile phone, a video phone, an e-book reader, a desktop PC, a laptop PC, a netbook PC, a Personal Digital Assistant (PDA), a Portable Multimedia Player (PMP), an mp3 player, a mobile medical device, a camera, a wearable device (e.g., a Head-Mounted Device (HMD), electronic clothes, electronic braces, an electronic necklace, an electronic appcessory, an electronic tattoo, or a smart watch), and/or the like.

According to various embodiments of the present disclosure, an electronic device may be a smart home appliance with communication functionality. A smart home appliance may be, for example, a television, a Digital Video Disk (DVD) player, an audio, a refrigerator, an air conditioner, a vacuum cleaner, an oven, a microwave oven, a washer, a dryer, an air purifier, a set-top box, a TV box (e.g., Samsung HomeSync™, Apple TV™, or Google TV™), a gaming console, an electronic dictionary, an electronic key, a camcorder, an electronic picture frame, and/or the like.

According to various embodiments of the present disclosure, an electronic device may be a medical device (e.g., Magnetic Resonance Angiography (MRA) device, a Magnetic Resonance Imaging (MRI) device, Computed Tomography (CT) device, an imaging device, or an ultrasonic device), a navigation device, a Global Positioning System (GPS) receiver, an Event Data Recorder (EDR), a Flight Data Recorder (FDR), an automotive infotainment device, a naval electronic device (e.g., naval navigation device, gyroscope, or compass), an avionic electronic device, a security device, an industrial or consumer robot, and/or the like.

According to various embodiments of the present disclosure, an electronic device may be furniture, part of a building/structure, an electronic board, electronic signature receiving device, a projector, various measuring devices (e.g., water, electricity, gas or electro-magnetic wave measuring devices), and/or the like that include communication functionality.

According to various embodiments of the present disclosure, an electronic device may be any combination of the foregoing devices. In addition, it will be apparent to one having ordinary skill in the art that an electronic device according to various embodiments of the present disclosure is not limited to the foregoing devices.

According to various embodiments of the present disclosure, an electronic device may be configured to communicate using Wideband Code Division Multiple Access (WCDMA) technology, Universal Mobile Telecommunication Service (UMTS) technology, and/or the like.

According to various embodiments of the present disclosure, an electronic device may comprise a control circuit for reducing a charging time.

Hereinafter, a control circuit for reducing a charging time and a method of driving the same according to the various embodiments of the present disclosure will be described. In addition, a control circuit for increasing a Constant Current (CC) period by reducing a loss corresponding to a Constant Voltage (CV) resistance and a method thereof are described.

Because users of electronic devices desire to use the devices for a longer time while carrying the devices, increasing the duration of a battery, reducing a charging time of the battery, and enabling the battery to be rapidly charged may be desired.

In general, a battery is charged in such a manner that a CC is supplied to the battery at an initial charging stage, and then, the battery is driven with a CV when a terminal voltage of the battery becomes charged to a certain voltage (e.g., 4.2 V), and the certain voltage (e.g., 4.2 V) is maintained and a charging current is monitored. A period elapsing until the terminal voltage of the battery becomes the certain voltage (e.g., 4.2 V) is referred to as a CC period, and a period elapsing until the battery is charged (e.g., completely charged) by driving the battery with the constant voltage is referred to as a CV period.

According to various embodiments of the present disclosure, a method for reducing a battery charging time and rapidly charging a battery includes increasing a charging current. However, even though the charging current is increased, the CC period becomes shorter if a CV resistance is high, and thus, the charging time increases. Therefore, according to various embodiments of the present disclosure, the battery charging time may be reduced by decreasing the CV resistance. In order to minimize (or otherwise reduce) the CV period, a battery cell voltage should be correctly measured. However, because measuring a correct battery cell voltage is difficult, reducing a resistance between an output terminal of a charger and a battery cell may be required so as to minimize the CV period.

A CV resistance may be generated due to a board resistance between the output terminal of the charger and the battery cell, a connector resistance or an internal resistance of a battery package. Various embodiments of the present disclosure are directed to reduction of the board resistance.

Most of terminal manufacturers inspect Radio Frequency (RF) characteristics and body characteristics of terminals when the terminals are mass produced. In order to inspect the terminal characteristics, the terminals are operated under various conditions that the terminals may possibly experience when being actually used. In this manner, actual operational characteristics of the terminals are inspected. Such inspection is a necessary process for predicting actual defect occurrence and satisfying customers. Because the terminal characteristic inspection is performed in consideration of various conditions as described above, voltages with various levels should be supplied to a terminal, and the terminal characteristic inspection should be performed for each level of voltage.

In the case of a terminal having a built-in battery, it is necessary to prevent a short circuit between external power (hereinafter referred to as process power) required for a process test and battery power when the process power is supplied. Therefore, a switch for separating the process power from the battery power is arranged between the battery and a charger. The process power may represent a power value that is initially set when a terminal is manufactured.

FIG. 1 is a circuit diagram illustrating a battery control circuit including an additional switch for separating process power from battery power in an electronic device having a built-in battery according to an embodiment of the present disclosure.

Referring to FIG. 1, the electronic device according to various embodiments of the present disclosure may include a charging unit 100, a built-in battery 110, a terminal set 120, and a switch 170 for separating the process power from the battery power.

The charging unit 100 may include a switch 101 that supplies charging power to the battery 110 after temporarily supplying power to the terminal set 120, when the power is supplied from an adapter for conversion between an Alternating Current (AC) and a Direct Current (DC). When the power is supplied from the adapter to the charging unit 100, the power is temporarily supplied to the terminal set 120 in order to boot up the terminal set 120 when the built-in battery 110 is completely discharged and has no power to be supplied to the terminal set 120. Process power 140 and charging power 130 supplied from the outside are connected to a connector of the terminal set 120 so as to be supplied thereto.

The terminal set 120 includes various components and a circuit pattern for connecting the components. The various components may include an audio processing unit having a microphone for collecting sounds and a speaker for playing the sound, a RF unit for establishing a communication channel to an external system, a data processing unit for processing data received by the RF unit, a key input unit for generating a key input signal, a camera for image capture, a display unit for displaying the images, a control unit for controlling the foregoing elements, and/or the like. The terminal set 120 may further include a printed circuit board on which the circuit pattern is formed, a connector to which a power jack is connected, and a charging circuit (e.g., charging unit 100) for charging the built-in battery 110.

The built-in battery 110, which is built in the electronic device to supply power to the terminal set 120, supplies constant power (e.g., 5V power), for operating the terminal set 120. For the built-in battery 110, a secondary battery or a rechargeable battery (e.g., a lithium cell, a nickel-cadmium cell, a hydrogen cell, a chemical cell, and/or the like), may be used.

The charging power 130 represents DC power output from the adapter that converts AC to DC.

The process power 140 is used to supply a test signal Test_sig for inspecting characteristics of each component included in the terminal set. The test signal Test_sig may include power with various levels. For example, test power VBTM may supply not only the constant-level power provided from the built-in battery 100 but also power having current and voltage higher than the current and voltage of the power provided from the built-in battery 110 and power having current and voltage lower than the current and voltage of the power provided from the built-in battery 110. Furthermore, the test signal of the process power 140 includes a control signal indicating that power is supplied power.

The charging unit 100 adjusts the charging power 130 according to a state of the built-in battery 110 to provide a charging current to the built-in battery 110 through a charging path 180. For example, the charging unit 100 supplies the constant current to the built-in battery 110 at an initial charging stage, and then drives the battery with a constant voltage when a terminal voltage of the battery becomes a certain voltage (e.g., 4.2 V) to maintain the voltage of 4.2 V and to monitor the charging current.

The switch 101 included in the charging unit 100 may include a back to back Field Effect Transistor (FET) switch used as a power path. In order to stably boot up the terminal set 120 even though the battery voltage is low when the adapter is inserted, the switch 101 may be turned off when the charging unit 100 is not initialized (at this time, the switch 170 is turned on or off), and then may be turned on after the charging unit is initialized (at this time, the switch 170 is turned on, and the power of the built-in battery 110 is supplied to the terminal set 120 through a power path 150). The turning on/off operation of the switch 101 included in the charging unit 100 may be controlled by a processor included in the terminal set 120 or an additional processor included in the charging unit 100. The switch 170 is turned on.

An inductor 160 may be added between the charging unit 100 and the terminal set 120.

The switch 170 is arranged between the charging unit 100 and the built-in battery 110 and is turned off when the process power 140 is supplied, so as to block the process power 140 from the built-in battery 110 and to provide the process power 140 to the terminal set 120 through the power path 150. The switch 101 included in the charging unit 100 is turned on.

The switch 101 may be designed as a back to back FET switch. For example, two FETs (e.g., a first FET 102 and a second FET 104), may be included in the switch 101. A source terminal of the first FET 102 may be connected to a source terminal of the second FET 104, a gate terminal of the first FET 102 may be connected to a gate terminal of the second FET 104, a drain terminal of the first FET 102 may be connected to the terminal set 120, and a drain terminal of the second FET 104 may be connected to the switch 170. A first diode 103 may be connected to the drain terminal and the source terminal of the first FET 102, and a second diode 105 may be connected to the drain terminal and the source terminal of the second FET 104. The first diode 103 and the second diode 105 may serve to prevent a voltage applied to a desired output from being backward to an input.

The switch 170 may be designed as a bidirectional back to back FET switch. For example, two FETs (e.g., a first FET 171 and a second FET 173), may be included in the switch 170. A source terminal of the first FET 171 may be connected to a source terminal of the second FET 173, a gate terminal of the first FET 171 may be connected to a gate terminal of the second FET 173, a drain terminal of the first FET 171 may be connected to the battery 110, and a drain terminal of the second FET 173 may be connected to the switch 101. A first diode 172 may be connected to the drain terminal and the source terminal of the first FET 171, and a second diode 174 may be connected to the drain terminal and the source terminal of the second FET 173. The first and second diodes 172 and 174 may serve to prevent a voltage applied to a desired output from being backward to an input.

Referring to FIG. 1, the switch 170 for a process includes two FETs both of which are turned off when the process power is applied so that the battery power is separated from the process power.

Due to internal Rds-on resistance of the FETs, a CV resistance increasing factor may be generated, causing increase of a charging time. The Rds-on resistance represents a resistance value measured when a transistor is turned on. The Rds-on resistance of each FET is generally about 8 m ohms. For example, total Rds-on resistance is about 16 m ohms. However, because a resistance value is increased due to heat, the Rds-on resistance may increase up to about 50 m ohms, causing increase of the CV resistance and increase of loss.

To overcome this limitation, various embodiments of the present disclosure provide a control circuit that separates the battery power from the process power without using an additional switch for a process when the process power is applied.

Figure 2:
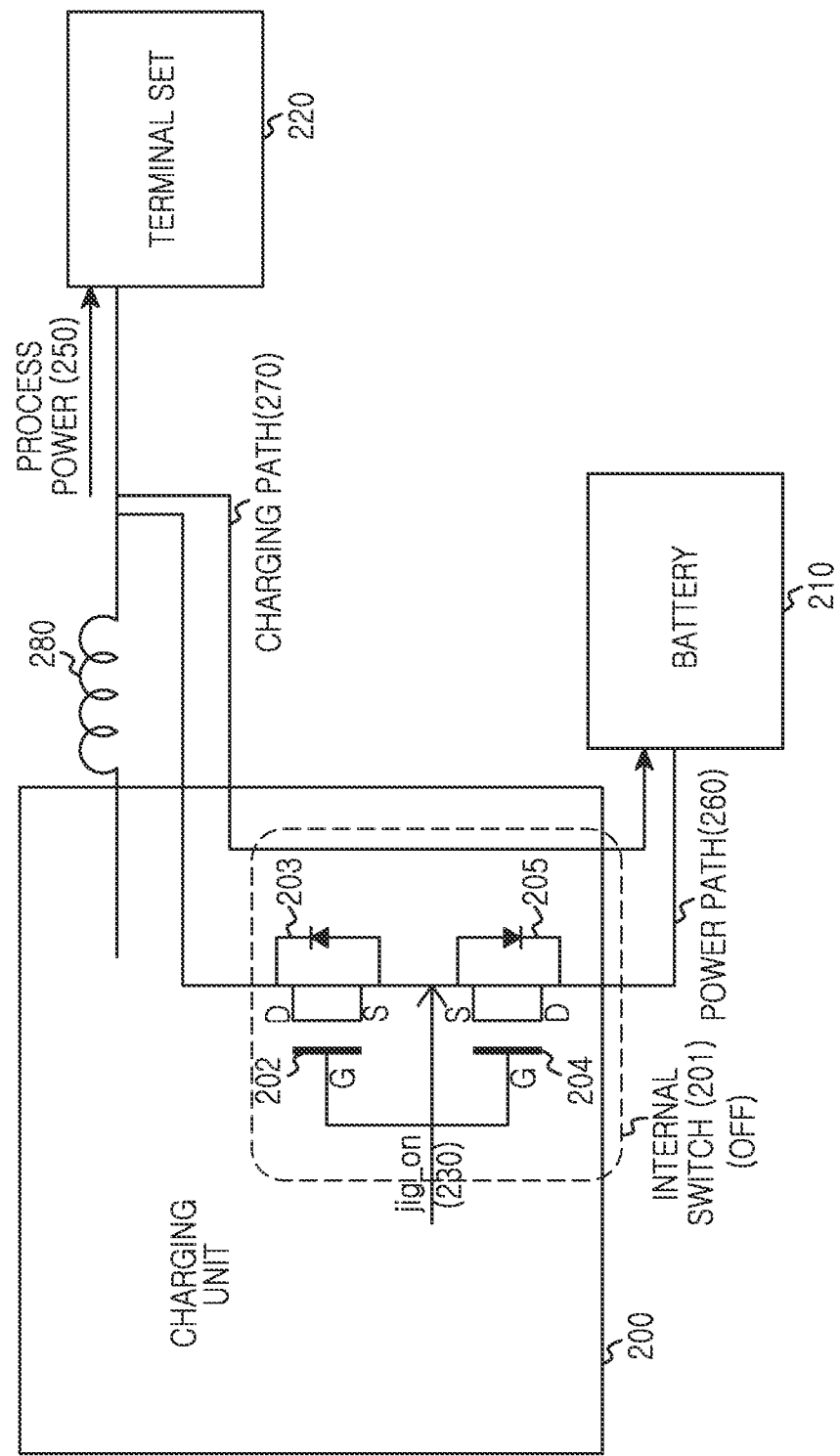
FIG. 2 is a circuit diagram illustrating a battery control circuit not including an additional switch for separating the process power from a battery power when a process power for a test is applied and a method for operating the same according to an embodiment of the present disclosure.

FIG. 2 is a circuit diagram illustrating a battery control circuit not including an additional switch for separating the process power from a battery power when a process power for a test is applied and a method for operating the same according to an embodiment of the present disclosure.

Referring to FIG. 2, an electronic device having a built-in battery may include a charging unit 200, a built-in battery 210, and a terminal set 220. The charging unit 200 may include a switch 201 that is turned off, when power is supplied from an adapter (not illustrated) for conversion between AC and DC (e.g., when the adapter is electrically connected to the charging unit 200), until the charging unit 200 is initialized so as to temporarily supply power to the terminal set 220. The switch 201 is turned on when the charging unit 200 is initialized so as to supply the charging power to the built-in battery 210. The switch 201 is turned off when the process power is input until a test is finished so as to continuously supply the process power to the terminal set 220.

The terminal set 220 includes various components and a circuit pattern for connecting the components. The various components may include an audio processing unit having a microphone for collecting sounds and a speaker for playing the sound, a RF unit for establishing a communication channel to an external system, a data processing unit for processing data received by the RF unit, a key input unit for generating a key input signal, a camera for image capture, a display unit for displaying the images, a control unit for controlling the foregoing elements, and/or the like. The terminal set 220 may further include a printed circuit board on which the circuit pattern is formed, a connector to which a power jack is connected, and a charging circuit (e.g., charging unit 200) for charging the built-in battery 210.

The built-in battery 210, which is built in the electronic device to supply power to the terminal set 220, supplies constant power (e.g., 5V power), for operating the terminal set 220 through a power path 260. For the built-in battery 210, a secondary battery or a rechargeable battery (e.g., a lithium cell, a nickel-cadmium cell, a hydrogen cell, a chemical cell, and/or the like), may be used.

A process power 250 is used to supply a test signal Test_sig for inspecting characteristics of each component included in the terminal set. The test signal Test_sig may include power with various levels. For example, test power VBTM may supply not only the constant-level power provided from the built-in battery 210 but also power having current and voltage higher than the current and voltage of the power provided from the built-in battery 210 and power having current and voltage lower than the current and voltage of the power provided from the built-in battery 210. Furthermore, the test signal of the process power 250 includes a control signal jig_on indicating that power is supplied power.

The charging unit 200 adjusts the charging power according to a state of the built-in battery 210 to provide a charging current to the built-in battery 210 through a charging path 270. For example, the charging unit 200 supplies a constant current to the built-in battery 210 at an initial charging stage, and then drives the battery with a constant voltage when a terminal voltage of the battery becomes a certain voltage (e.g., 4.2 V) to maintain the voltage of 4.2 V and to monitor the charging current.

The internal switch 201 of the charging unit 200 may include a back to back FET used as a power path. When the external process power 250 is input, the control signal jig_on is input concurrently with process power 250. The control signal jig_on may indicate that external power is the process power. When the control signal jig-on is input, the switch 201 is turned off so as to block the process power 250 from being supplied to the battery 210 and to prevent the battery 210 from supplying power to the terminal set 220. Thereafter, the switch 201 is turned off until the process test is finished. According to various embodiments of the present disclosure, the process power 250 is directly supplied to the terminal set 220.

The switch 201 may be designed as a back to back FET switch. For example, two FETs (e.g., a first FET 202 and a second FET 204), may be included in the switch 201. A source terminal of the first FET 202 may be connected to a source terminal of the second FET 204, a gate terminal of the first FET 202 may be connected to a gate terminal of the second FET 204, a drain terminal of the first FET 202 may be connected to the terminal set 220, and a drain terminal of the second FET 204 may be connected to the battery. A first diode 203 may be connected to the drain terminal and the source terminal of the first FET 202, and a second diode 205 may be connected to the drain terminal and the source terminal of the second FET 204. The first diode 203 and the second diode 205 may serve to prevent a voltage applied to a desired output from being backward to an input.

An inductor 280 may be added between the charging unit 200 and the terminal set 220.

Figure 3:
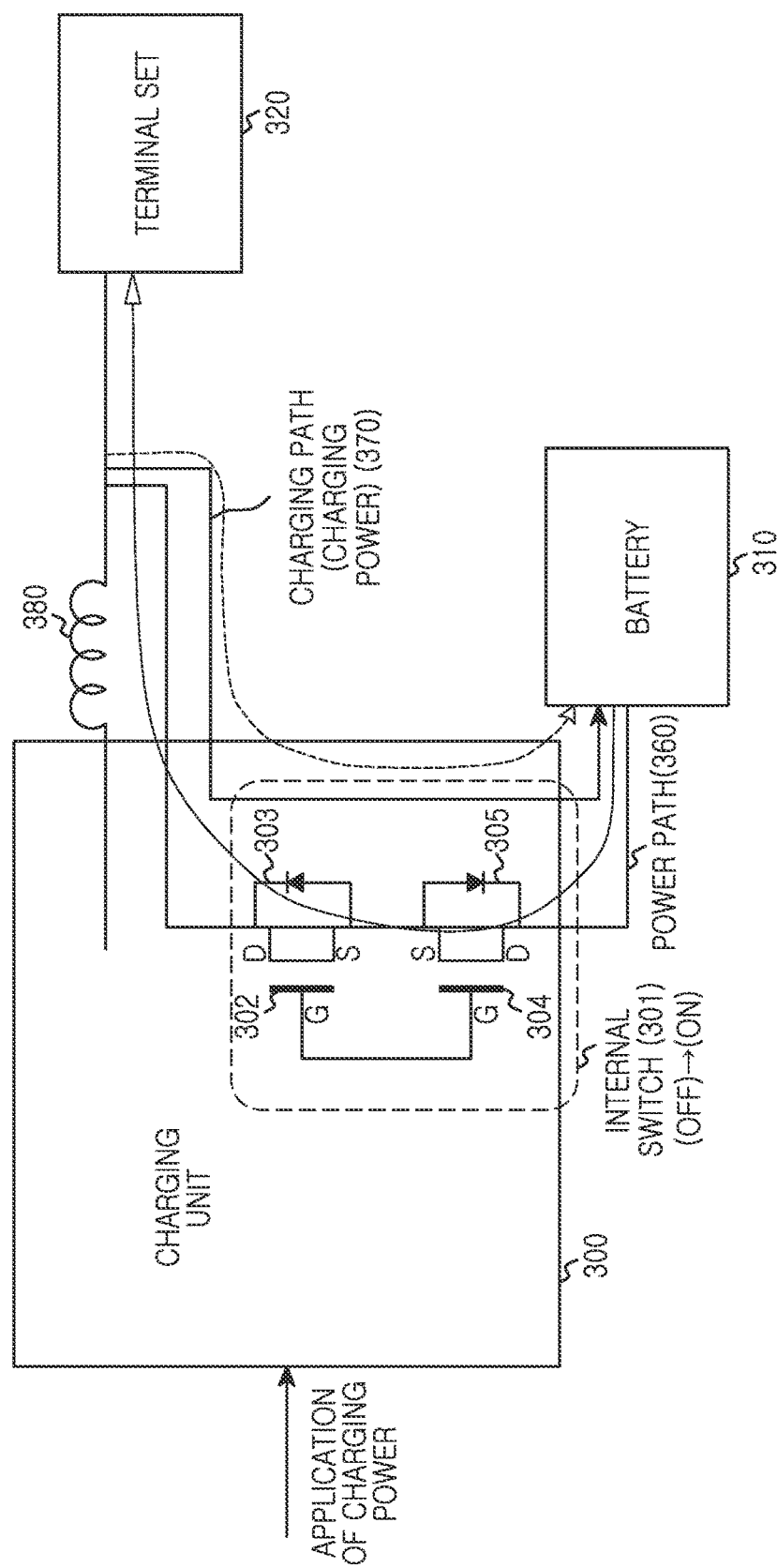
FIG. 3 is a circuit diagram illustrating a battery control circuit not including an additional switch for separating the process power from a battery power when general power for charging a battery is applied according to an embodiment of the present disclosure.

FIG. 3 is a circuit diagram illustrating a battery control circuit not including an additional switch for separating the process power from a battery power when general power for charging a battery is applied and a method for operating the same according to an embodiment of the present disclosure.

Referring to FIG. 3, an electronic device having a built-in battery may include a charging unit 300, a built-in battery 310, and a terminal set 320. The charging unit 300 may include a switch 301 that is turned off, when power is supplied from an adapter (not illustrated) for conversion between AC and DC (e.g., when the adapter is electrically connected to the charging unit 300), until the charging unit 300 is initialized so as to temporarily supply power to the terminal set 320. The switch 301 is turned on when the charging unit 300 is initialized so as to supply the charging power to the built-in battery 310.

The terminal set 320 includes various components and a circuit pattern for connecting the components. The various components may include an audio processing unit having a microphone for collecting sounds and a speaker for playing the sound, a RF unit for establishing a communication channel to an external system, a data processing unit for processing data received by the RF unit, a key input unit for generating a key input signal, a camera for image capture, a display unit for displaying the images, a control unit for controlling the foregoing elements, and/or the like. The terminal set 320 may further include a printed circuit board on which the circuit pattern is formed, a connector to which a power jack is connected, and a charging circuit (e.g., charging unit 300) for charging the built-in battery 310.

The built-in battery 310, which is built in the electronic device to supply power to the terminal set 320, supplies constant power (e.g., 5V power), for operating the terminal set 320 through a power path 360. For the built-in battery 310, a secondary battery or a rechargeable battery (e.g., a lithium cell, a nickel-cadmium cell, a hydrogen cell, a chemical cell, and/or the like), may be used.

The charging unit 300 adjusts charging power 330 according to a state of the built-in battery 310 to provide a charging current to the built-in battery 310 through a charging path 370. For example, the charging unit 300 supplies a constant current to the built-in battery 310 at an initial charging stage, and then drives the battery with a constant voltage when a terminal voltage of the battery becomes a certain voltage (e.g., 4.2 V) to maintain the voltage of 4.2 V and to monitor the charging current.

The charging power 330 represents DC power output from the adapter that converts AC to DC.

The switch 301 included in the charging unit 300 may include a back to back FET switch used as a power path. In order to stably boot up the terminal set 320 even though the battery voltage is low when the adapter is inserted, the switch 301 may be turned off when the charging unit 300 is not initialized. The switch 301 may be turned on after the charging unit is initialized. When the switch 301 is turned off, the charging unit 300 directly supplies the charging power 330 to the terminal set 320 or converts the charging power 330 to operating power of the terminal set 320 to supply the operating power thereto. When the switch 301 is turned on, power (e.g., 5V power) of the battery 310 is supplied to the terminal set 320.

The turning on/off operation of the switch 301 included in the charging unit 300 may be controlled by a processor included in the terminal set 320 or an additional processor included in the charging unit 300.

The switch 301 may be designed as a back to back FET switch. For example, two FETs (e.g., a first FET 302 and a second FET 304), may be included in the switch 301. A source terminal of the first FET 302 may be connected to a source terminal of the second FET 304, a gate terminal of the first FET 302 may be connected to a gate terminal of the second FET 304, a drain terminal of the first FET 302 may be connected to the terminal set 320, and a drain terminal of the second FET 304 may be connected to the battery. A first diode 303 may be connected to the drain terminal and the source terminal of the first FET 302, and a second diode 305 may be connected to the drain terminal and the source terminal of the second FET 304. The first diode 303 and the second diode 305 may serve to prevent a voltage applied to a desired output from being backward to an input.

An inductor 380 may be added between the charging unit 300 and the terminal set 320.

Figure 4:
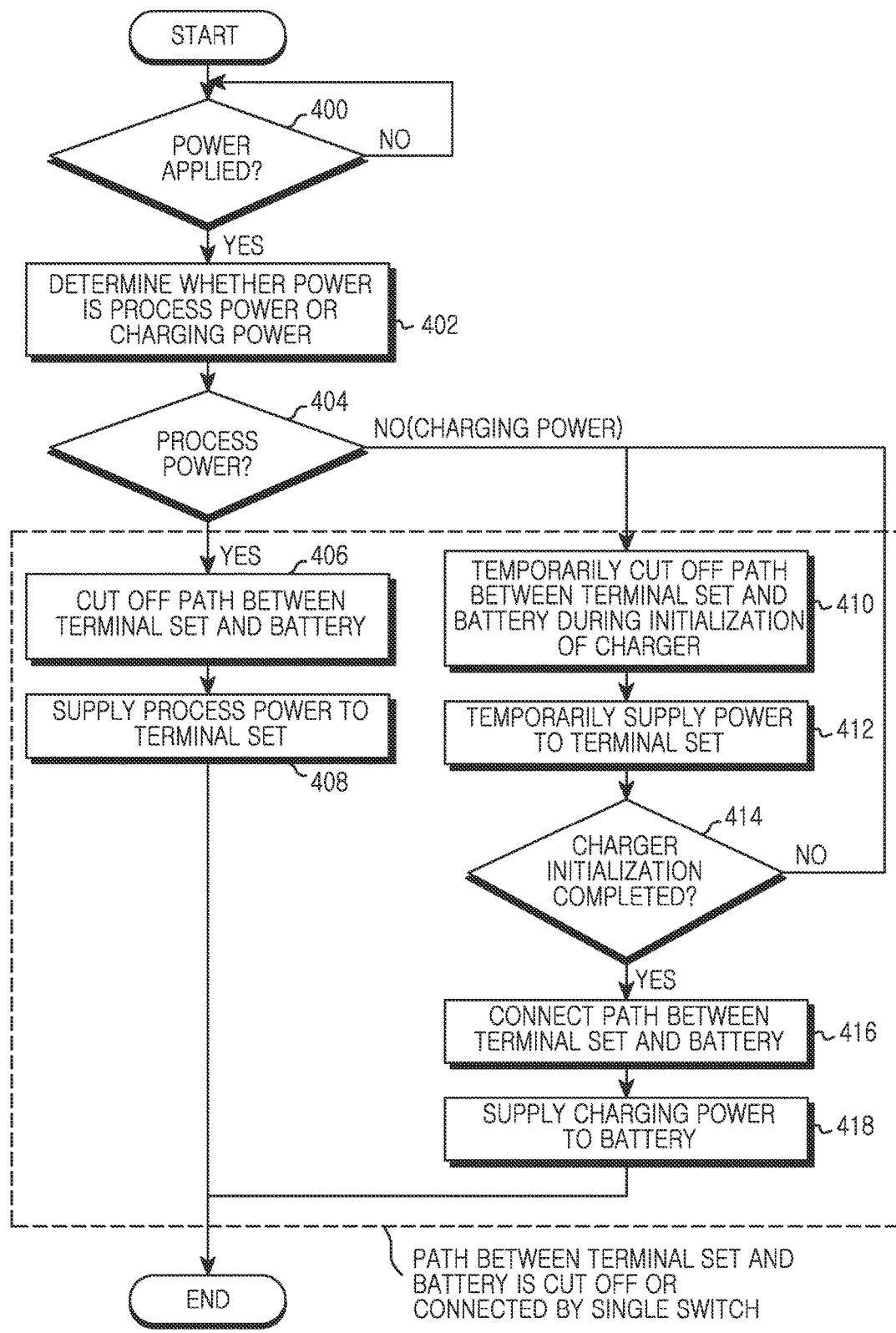
FIG. 4 is a flowchart illustrating a method for operating a battery control circuit according to an embodiment of the present disclosure.

FIG. 4 is a flowchart illustrating a method for operating a battery control circuit according to an embodiment of the present disclosure.

Referring to FIG. 4, at operation 400, the charging unit 200 or 300 determines whether power is applied thereto.

If the charging unit 200 or 300 determines that power is not applied thereto at operation 400, then the charging unit 200 or 300 may continue to poll for an indication that power is applied to the charging unit 200 or 300.

In contrast, if the charging unit 200 or 300 determines that power is applied thereto at operation 400, the charging unit 200 or 300 may proceed to operation 402 at which the charging unit 200 or 300 determines whether power is process power or charging power. For example, when external power is applied in operation 400, the charging unit 200 or 300 determines whether the external power is process power or charging power.

The charging power represents DC power output from an adapter that converts AC to DC. The process power is used to supply a test signal Test_sig for inspecting characteristics of each component included in a terminal set, and may include a control signal jig_on indicating that the external power is the process power. For example, the charging unit 200 or 300 may determine whether the applied external power is the process power or the charging power according to whether the control signal jig_on exists.

At operation 404, the charging unit 200 or 300 determines whether the power is process power.

If the charging unit 200 or 300 determines that the power is process power at operation 404, then the charging unit 200 or 300 may proceed to operation 406 at which the charging unit 200 or 300 cuts off a path between the terminal set and the battery. For example, when the applied external power is determined to be the process power at operation 404, the charging unit 200 or 300 cuts off the power path between the terminal set and the battery using the internal switch 201 or 301.

At operation 408, the charging unit 200 or 300 supplies the process power to the terminal set For example, the process power may be directly supplied to the terminal set 220 or 320, and the internal switch 201 or 301 is turned off as the control signal jig_on of the process power is input, and thus, the power path between the terminal set and the battery may be blocked. While the process power is supplied to the terminal set 220 or 320, the internal switch 201 or 301 remains turned off.

In contrast, if the charging unit 200 or 300 determines that the power is not process power (e.g., that the power is charging power) at operation 404, then the charging unit 200 or 300 may proceed to operation 410 at which the charging unit 200 or 300 may temporarily cut off a power path between the terminal set and the battery during initialization of the charging unit 200 or 300. For example, when the applied external power is determined to be the charging power at operation 404, the charging unit 200 or 300 may cut off the power path between the terminal set and the battery using the internal switch 201 or 301 until initialization is completed.

Thereafter, at operation 412, the charging unit 200 or 300 may temporally supply the charging power to the terminal set directly until the initialization is completed or may convert the charging power to operating power of the terminal set to supply the operating power thereto.

At operation 414, the charging unit 200 or 300 may determine whether charger initialization is completed.

If the charging unit 200 or 300 determines that charger initialization is not completed at operation 414, then the charging unit 200 or 300 may proceed to operation 410.

If the charging unit 200 or 300 determines that charger initialization is not completed at operation 414, then the charging unit 200 or 300 may proceed to operation 416 at which the charging unit 200 or 300 may connect a path between the terminal set and the battery. For example, the initialization is determined to be completed at operation 414, the charging unit 200 or 300 cuts off the power path between the terminal set and the battery at operation 416.

At operation 418, the charging unit 200 or 300 supplies the battery power (e.g., 5V power) to the terminal set. The charging power may be converted to a charging current or a charging voltage so as to be provided to the battery 210 or 310.

Figure 5:
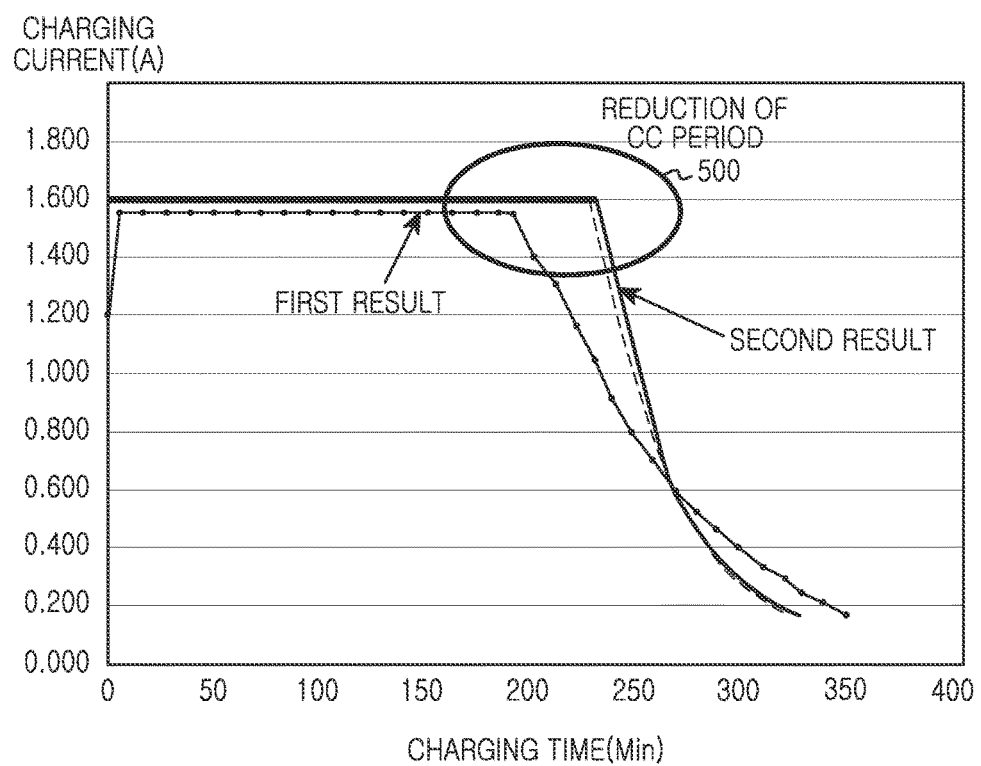
FIG. 5 is a graph for comparing Constant Current (CC) periods according to an embodiment of the present disclosure.

FIG. 5 is a graph for comparing CC periods according to an embodiment of the present disclosure.

Referring to FIG. 5, a charging current decreases when a charging time reaches a certain time. A first result indicates the relation between the charging time and the charging current when the CV resistance higher than that of a second result is applied, and the second result indicates the relation between the charging time and the charging current when the CV resistance lower than that of the first result is applied.

As shown, it may be understood that the charging time becomes longer as the CV resistance becomes higher and the charging time becomes shorter as the CV resistance becomes lower. In other words, the CC period becomes shorter as the CV resistance becomes higher, and the CC period becomes longer as the CV resistance becomes lower. As illustrated in FIG. 5, reference numeral 500 illustrates an area on the respective graphs at which a CC period is reduced.

A method for controlling power of a charging device, the method comprising: determining whether applied power is process power or charging power; cutting off a path between a terminal set and a battery while the process power is applied, when the applied power is the process power; and supplying the process power to the terminal set.

The method further comprises cutting off the path between the terminal set and the battery during charging initialization, when the applied power is the charging power; and supplying corresponding power to the terminal set.

The method further comprises connecting the path between the terminal set and the battery when the charging initialization is completed; and supplying a charging current or a charging voltage to the battery.

Wherein the corresponding power is the charging power or operating power of the terminal set obtained by converting the charging power, and wherein the process power is power initially set when a terminal is manufactured.

Wherein the connecting or cutting off the path between the terminal set and the battery according to the process power or the charging power is controlled by a single switch.

Wherein the process power is directly provided to the terminal set.

The method further comprises if the applied power is charging power, adjusting the charging power according to a state of the battery.

Wherein the adjusting of the charging power comprises driving the battery with a constant voltage when a terminal voltage of the battery is equal to or greater than a threshold voltage. As described above, according to the control circuit for reducing the charging time and the method for operating the same proposed by various embodiments of the present disclosure, DC resistance is decreased by removing a dedicated switch for separating the process power from the battery power, thereby reducing total CV resistance.

Furthermore, according to various embodiments of the present disclosure, as the CV resistance is decreased, the CC period increases, and thus, the charging time may be reduced.

Moreover, according to various embodiments of the present disclosure, by replacing the switch for separating the process power from the battery power with a switch for another usage, improvements on a circuit area and cost may be obtained.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A charging device comprising:
an input unit configured to receive a control signal indicating that test power is applied to a terminal set; and
a switch configured to:
cut off a path between a terminal set and a battery, when the control signal is received, and
connect, when charging power is applied to the charging device, the path between the terminal set and the battery to supply the charging power to the battery,
wherein the switch is embedded to the charging device,
wherein the test power is directly applied to a terminal set, and
wherein the battery is directly connected to a one side of the switch, and the terminal set is directly connected to another side of the switch.

2. The charging device of claim 1,
wherein the switch is further configured to cut off the path between the terminal set and the battery during charging initialization when the charging power is applied to the switch, and
wherein the charging device further comprises an output unit configured to supply corresponding power to the terminal set while the path between the terminal set and the battery is cut off.

3. The charging device of claim 2,
wherein the switch is further configured to connect the path between the terminal set and the battery when the charging initialization is completed, and
wherein the output unit is further configured to supply a charging current or a charging voltage to the battery.

4. The charging device of claim 2,
wherein the corresponding power is the charging power or operating power of the terminal set obtained by converting the charging power, and
wherein test power is power initially set when a terminal is manufactured.

5. The charging device of claim 1, wherein the switch comprises a bidirectional back to back Field-Effect Transistor (FET).

6. The charging device of claim 5, wherein, in the switch, a source terminal of a first FET is connected to a source terminal of a second FET, a gate terminal of the first FET is connected to a gate terminal of the second FET, a drain terminal of the first FET is connected to the terminal set, a drain terminal of the second FET is connected to the battery, the drain terminal and the source terminal of the first FET are connected to a first diode, and the drain terminal and the source terminal of the second FET are connected to a second diode.

7. An electronic device comprising:
a terminal set;
a battery; and
a charging unit configured to embed a switch controlling a path between the terminal set and the battery in response to a control signal indicating that test power is applied to the terminal set,
wherein the switch:
cuts off the path between the terminal set and the battery when the control signal is received, and
connects, when charging power is applied to the charging unit, the path between the terminal set and the battery to supply the charging power to the battery, and
wherein the battery is directly connected to a one side of the switch, and the terminal set is directly connected to another side of the switch.

8. The electronic device of claim 7,
wherein the switch is further configured to cut off the path between the terminal set and the battery during charging initialization when the charging power is applied to the switch, and
wherein the electronic device further comprises an output unit configured to supply corresponding power to the terminal set while the path between the terminal set and the battery is cut off.

9. The electronic device of claim 7,
wherein the switch is further configured to connect the path between the terminal set and the battery when the charging initialization is completed, and
wherein the output unit is further configured to supply a charging current or a charging voltage to the battery.

10. The electronic device of claim 7,
wherein the corresponding power is the charging power or operating power of the terminal set obtained by converting the charging power, and
wherein the test power is power initially set when a terminal is manufactured.

11. The electronic device of claim 7, wherein the switch comprises a bidirectional back to back Field-Effect Transistor (FET).

12. The electronic device of claim 10, wherein, in the switch, a source terminal of a first FET is connected to a source terminal of a second FET, a gate terminal of the first FET is connected to a gate terminal of the second FET, a drain terminal of the first FET is connected to the terminal set, a drain terminal of the second FET is connected to the battery, the drain terminal and the source terminal of the first FET are connected to a first diode, and the drain terminal and the source terminal of the second FET are connected to a second diode.

13. A method for controlling power of a charging device embedding a switch controlling a path between a terminal set and a battery, the method comprising:
cutting off, by the switch, the path between the terminal set and the battery when a control signal indicating that test power is applied to the terminal set is received; and
when charging power is applied to the charging device, connecting, by the switch, the path between the terminal set and the battery to supply the charging power to the battery,
wherein the test power is directly applied to a terminal set, and
wherein the battery is directly connected to one side of the switch, and the terminal set is directly connected to another side of the switch.

14. The method of claim 13, further comprising:
cutting off the path between the terminal set and the battery during charging initialization, when the charging power is applied to the switch; and
supplying corresponding power to the terminal set.

15. The method of claim 14, further comprising:
connecting the path between the terminal set and the battery when the charging initialization is completed; and
supplying a charging current or a charging voltage to the battery.

16. The method of claim 14,
wherein the corresponding power is the charging power or operating power of the terminal set obtained by converting the charging power, and
wherein the test power is power initially set when a terminal is manufactured.

17. The method of claim 13, further comprising:
adjusting the charging power according to a state of the battery.

18. The method of claim 17, wherein the adjusting of the charging power comprises: driving the battery with a constant voltage when a terminal voltage of the battery is equal to or greater than a threshold voltage.

* * * * *